United States Patent
Gadinski

(10) Patent No.: US 10,465,097 B2
(45) Date of Patent: Nov. 5, 2019

(54) ALIPHATIC UV CURED POLYURETHANE OPTICAL ENDPOINT DETECTION WINDOWS WITH HIGH UV TRANSPARENCY FOR CMP POLISHING PADS

(71) Applicant: Rohm and Haas Electronic Materials CMP Holdings, Inc., Newark, DE (US)

(72) Inventor: Matthew R. Gadinski, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 168 days.

(21) Appl. No.: 15/815,121

(22) Filed: Nov. 16, 2017

(65) Prior Publication Data

US 2019/0144713 A1    May 16, 2019

(51) Int. Cl.
| | |
|---|---|
| *C09K 3/14* | (2006.01) |
| *C09G 1/16* | (2006.01) |
| *C08L 75/16* | (2006.01) |
| *C08G 81/02* | (2006.01) |
| *C08F 220/18* | (2006.01) |
| *C08F 220/06* | (2006.01) |
| *C08F 2/48* | (2006.01) |
| *B24D 3/00* | (2006.01) |
| *B24D 11/00* | (2006.01) |
| *B24D 18/00* | (2006.01) |
| *H01L 21/321* | (2006.01) |

(52) U.S. Cl.
CPC .................. *C09G 1/16* (2013.01); *C08F 2/48* (2013.01); *C08F 220/06* (2013.01); *C08F 220/18* (2013.01); *C08G 81/024* (2013.01); *C08L 75/16* (2013.01); *H01L 21/3212* (2013.01)

(58) Field of Classification Search
USPC .................................................. 51/293, 298
See application file for complete search history.

(56) References Cited

U.S. PATENT DOCUMENTS

| | | | |
|---|---|---|---|
| 3,711,571 A | 1/1973 | Farah | |
| 5,773,486 A | 6/1998 | Chandross et al. | |
| 6,685,537 B1 | 2/2004 | Fruitman et al. | |
| 7,927,183 B2 | 4/2011 | Fukuda et al. | |
| 8,512,427 B2 | 8/2013 | Xie et al. | |
| 8,845,852 B2 | 9/2014 | Nakamori et al. | |
| 9,333,520 B2 | 5/2016 | McLain et al. | |
| 9,594,188 B2 | 3/2017 | Chauhan et al. | |
| 2013/0273813 A1 | 10/2013 | Prasad | |
| 2014/0256232 A1* | 9/2014 | Repper | B24B 37/205 451/41 |
| 2014/0357170 A1* | 12/2014 | Qian | B24B 37/205 451/527 |
| 2015/0231765 A1* | 8/2015 | Kolesar | B24D 11/008 51/296 |
| 2015/0273651 A1 | 10/2015 | Qian et al. | |
| 2015/0306730 A1* | 10/2015 | Qian | B24B 37/013 51/298 |
| 2015/0306731 A1* | 10/2015 | Qian | H01L 21/30625 51/298 |
| 2016/0136787 A1 | 5/2016 | Bajaj et al. | |
| 2016/0375554 A1* | 12/2016 | Qian | B24D 18/0009 51/298 |

FOREIGN PATENT DOCUMENTS

CN           105922126 A      9/2016

* cited by examiner

*Primary Examiner* — James E McDonough
(74) *Attorney, Agent, or Firm* — Andrew Merriam

(57) ABSTRACT

The present invention provides chemical mechanical (CMP) polishing pads for polishing a substrate chosen from a semiconductor substrate comprising the CMP polishing pad and having one or more endpoint detection windows which is the cured product of a reaction mixture of a linear cycloaliphatic urethane macromonomer having two (meth) acrylate endgroups bound via cycloaliphatic dicarbamate esters to a polyether, polycarbonate or polyester chain having an average molecular weight of from 450 to 2,000, or an cycloaliphatic urethane oligomer thereof, and an aliphatic initiator, wherein the total isocyanate content in the urethane macromonomer ranges from 3.3 to 10 wt. %, and, further wherein, the composition comprises less than 5 wt. % of unreacted (meth)acrylate monomer and is substantially free of unreacted isocyanate. Regardless of their hardness or lack thereof, the endpoint detection windows provide excellent durability when wet.

10 Claims, No Drawings

ALIPHATIC UV CURED POLYURETHANE OPTICAL ENDPOINT DETECTION WINDOWS WITH HIGH UV TRANSPARENCY FOR CMP POLISHING PADS

The present invention relates to formulations for ultraviolet (UV) transparent endpoint detection windows, a chemical mechanical polishing pad (CMP polishing pad) with one or more endpoint detection windows, and methods for CMP polishing using the CMP polishing pad. More particularly, the present invention relates to a composition comprising a reaction mixture of a linear cycloaliphatic urethane macromonomer having two (meth)acrylate endgroups bound via cycloaliphatic dicarbamate esters to a polyether, polycarbonate or polyester chain, or an cycloaliphatic urethane oligomer thereof, and an aliphatic initiator, such as a photoinitiator or a thermal initiator, such as azo-bis isobutyronitrile (AIBN) as well as to a CMP polishing pad having one or more endpoint detection windows which is the cured product of the reaction mixture and methods of making and using the same.

Chemical mechanical planarization, or chemical mechanical polishing (CMP), has commonly been used to planarize one or more of the multiple thin layers of conducting, semiconducting and dielectric materials that comprise integrated circuits and other electronic device substrates, such as semiconductor wafers. Planarization is useful in removing undesired surface topography and surface defects, such as rough surfaces, agglomerated materials, crystal lattice damage, scratches, and contaminated layers or materials. In conventional CMP, a substrate is mounted on a carrier assembly and positioned in contact with a polishing pad in a CMP apparatus. The carrier assembly applies a controlled pressure to the substrate by pressing it against the CMP polishing pad while the pad is moved (e.g., rotated) relative to the substrate by an external driving force. Simultaneously therewith, a polishing medium (e.g., slurry) provided between the wafer and the CMP polishing pad acts to polish and planarize the substrate surface by the chemical and mechanical action of the pad surface and the polishing medium.

One challenge presented in CMP polishing is determining when the substrate has been polished to the desired extent. In situ methods for determining polishing endpoints have been developed. The in situ optical end pointing techniques can be divided into two basic categories: (1) monitoring a reflected optical signal at a single wavelength, such as light from a laser source, or (2) monitoring a reflected optical signal from multiple wavelengths. Typical wavelengths used for optical end pointing include those in the visible spectrum (e.g., 400 to 700 nm), the ultraviolet spectrum (300 to 400 nm), and the infrared spectrum (e.g., 700 to 1000 nm). In monitoring an optical signal, the reflectivity of the substrate changes as the composition at the substrate surface changes from one material to another. This change in reflectivity is then used to detect the CMP polishing endpoint. For example, a spectrometer has been used to acquire an intensity spectrum of reflected light in the visible range of the optical spectrum while using the whole spectrum to detect the polishing endpoint. To accommodate these optical end point measuring techniques, CMP polishing pads have been developed having endpoint detection windows. However, conventional polymer containing endpoint detection windows often exhibit undesirable degradation upon exposure to light having a wavelength of 300 to 425 nm. Further, known endpoint detection window materials for use in CMP polishing pads have a low transmittance at wavelengths below 400 nm. Accordingly, there remains a need for endpoint detection window materials that have sufficient transmittance at wavelengths below 400 nm and which do not degrade excessively upon exposure to such radiation at wavelengths below 400 nm.

One solution to the low transmittance problem to reduce polishing defects, such as micro-scratches or chatter marks, was to use a more aliphatic window material. For example, U.S. Pat. No. 7,927,183, to Fukuda et al., discloses a polishing pad wherein at least a window portion of the CMP polishing pad exhibits a light transmittance of 30% or more in the overall range of wavelengths of 300 to 400 nm. The Fukuda endpoint detection window materials comprise a polyurethane resin having an aromatic ring density of 2 wt. % or less. Such aliphatic isocyanate containing polyurethane materials can provide improved light transmittance over a broad light spectrum. Unfortunately, the aliphatic polyurethane endpoint detection windows disclosed in Fukuda lack the requisite durability required for demanding CMP polishing pad applications. In particular, in CMP polishing pads that are skived from a molded article contain a window material implanted or placed as a plug in the article, the skiving itself abrades and damages the window surface. Further, alternatives to skiving, such as forming and placing individual windows into a recess in the pad adapted to receive them, have proven time consuming to implement and may result in window to pad adhesion problems. In addition, the polyurethane window materials were abraded by CMP polishing pad conditioning which uses a conditioning disk to form microtextures in the pad surface for polishing.

The present inventors have endeavored to provide a durable endpoint detection window material for use in CMP polishing pads that has acceptable ultraviolet (UV) transmission at 300 to 400 nm without suffering abrasions in pad conditioning, that improves adhesion between window and pad in use and that enables rapid window customization for both soft and hard pads without skiving to form the window.

STATEMENT OF THE INVENTION

In one aspect of the present invention, endpoint detection window compositions comprise a reaction mixture of a linear cycloaliphatic urethane macromonomer having two (meth)acrylate endgroups bound via cycloaliphatic dicarbamate esters to a polyether, polycarbonate or polyester chain, or an cycloaliphatic urethane oligomer thereof, and an aliphatic initiator, such as an aliphatic photoinitiator or an aliphatic thermal initiator, wherein the total reacted and unreacted isocyanate content in the urethane macromonomer ranges from 3.3 to 10 wt. %, or, preferably, from 4 to 9 wt. %, and, further wherein, the composition comprises less than 5 wt. % or, preferably, less than 2 wt. % of unreacted (meth)acrylate monomer and, further, is substantially free of unreacted isocyanate.

In accordance with the endpoint detection window compositions of the present invention, wherein the cycloaliphatic dicarbamate of the linear cycloaliphatic urethane macromonomer contains a $C_6$ to $C_{18}$ or, preferably, a $C_{10}$ to $C_{16}$ cycloaliphatic group, preferably, a methylene dicyclohexyl or a dicyclohexyl group.

In accordance with the endpoint detection window compositions of the present invention, wherein the initiator is a photoinitiator, preferably, camphorquinone or other aliphatic initiators.

In accordance with the endpoint detection window compositions of the present invention, wherein the amount of the initiator ranges from 0.05 to 0.5 wt. % or, preferably, from 0.08 to 0.15 wt. %, based on the total solids weight of the reaction mixture.

1. In a second aspect of the present invention, chemical mechanical (CMP) polishing pads for polishing a substrate chosen from at least one of a magnetic substrate, an optical substrate and a semiconductor substrate comprise a CMP polishing pad, preferably a polyurethane foam pad, having one or more endpoint detection windows which is the cured product of a reaction mixture of a linear cycloaliphatic urethane macromonomer having two (meth)acrylate endgroups bound via cycloaliphatic dicarbamate esters to a polyether, polycarbonate or polyester chain, or an cycloaliphatic urethane oligomer thereof, and an aliphatic initiator, preferably, a photoinitiator, such as camphorquinone, wherein the total (reacted and unreacted) isocyanate content in the urethane macromonomer ranges from 3.3 to 10 wt. %, or, preferably, from 4 to 9 wt. %, and, further wherein, the composition comprises less than 5 wt. % or, preferably, less than 2 wt. % of unreacted (meth)acrylate monomer and is substantially free of unreacted isocyanate.

2. In accordance with the CMP polishing pads of the present invention as in item 1, above, wherein the cycloaliphatic dicarbamate of the linear cycloaliphatic urethane macromonomer contains a $C_6$ to $C_{18}$ or, preferably, a $C_{10}$ to $C_{16}$ cycloaliphatic group, preferably, a methylene dicyclohexyl or a dicyclohexyl group.

3. In accordance with the chemical mechanical polishing pad of the present invention as in any one of items 1 or 2, above, wherein the cycloaliphatic dicarbamate of the linear cycloaliphatic urethane macromonomer is the reaction product of an active hydrogen of a polymeric diol and a cycloaliphatic diisocyanate chosen from, 1,4-cyclohexane diisocyanate, 4,4'-dicyclohexylmethane diisocyanate, isophorone diisocyanate, or, preferably, methylene bis-cyclohexyl isocyanate (4,4'-dicyclohexylmethane diisocyanate).

4. In accordance with the chemical mechanical polishing pad of the present invention as in any one of items 1, 2, or 3, above, wherein the linear cycloaliphatic urethane macromonomer comprises the carbamate of a polymeric diol having a polyether, polycarbonate or polyester chain having an average molecular weight of from 450 to 2,000, or, preferably, from 600 to 1500.

5. In accordance with the chemical mechanical polishing pad of the present invention as in item 4, wherein the carbamate of the polymeric diol comprises the carbamate of a polypropylene glycol; a polyethylene glycol; a polytetramethylene glycol; polycarbonate-group containing diol, such as a diol of an aliphatic polycarbonate, for example, a diol of poly(trimethylene carbonate); or their block copolymers or mixtures.

6. In accordance with the chemical mechanical polishing pad of the present invention as in any one of items 1, 2, 3, 4 or 5, wherein the linear cycloaliphatic urethane macromonomer having two (meth)acrylate endgroups comprises from two to ten or, preferably, from 2 to 4, cycloaliphatic dicarbamate groups and has a weight average molecular weight of from 1,000 to 10,000 or, preferably, from 1,100 to 8,000.

7. In accordance with the chemical mechanical polishing pad of the present invention as in any one of items 1, 2, 3, 4, 5 or 6, above, wherein the linear cycloaliphatic urethane macromonomer having two (meth)acrylate endgroups contains, in esterified form, a hydroxyl functional alkyl (meth)acrylate.

8. In accordance with the chemical mechanical polishing pad of the present invention as in item 7, above, wherein the hydroxyl functional alkyl (meth)acrylate is chosen from a $C_1$ to $C_4$ hydroxyalkyl acrylate, a $C_1$ to $C_4$ hydroxyalkyl methacrylate, or glycerol (meth)acrylate, preferably, a $C_1$ to $C_4$ hydroxyalkyl methacrylate, such as hydroxyethyl methacrylate.

9. In accordance with the chemical mechanical polishing pad of the present invention as in any one of items 1, 2, 3, 4, 5, 6, 7 or 8, above, wherein the amount of (meth)acrylate endgroups ranges from 4 to 19 wt. %, or, preferably, from 7 to 15 wt. % or, more preferably, from 9 to 14 wt. %, based on the total weight of the linear cycloaliphatic urethane macromonomer having two (meth)acrylate endgroups.

10. In accordance with the chemical mechanical polishing pad of the present invention as in any one of items 1, 2, 3, 4, 5, 6, 7, 8, or 9, above, wherein the reaction mixture further comprises a tertiary amine containing co-initiator or accelerator, preferably, N-methyldiethanolamine or triethylenediamine.

11. In accordance with the chemical mechanical polishing pad of the present invention as in any one of items 1 to 10, above, wherein the amount of the aliphatic initiator ranges from 0.05 to 0.5 wt. % or, preferably, from 0.08 to 0.15 wt. %, based on the total solids weight of the reaction mixture.

12. In accordance with the chemical mechanical polishing pad of the present invention as in any one of items 1 to 11, above, wherein the one or more endpoint detection windows has a Shore D hardness ASTM D2240-15 (2015) of from 20 to 70 or, preferably, from 20 to 55.

In a third aspect of the present invention, methods of making a CMP polishing pad as in any of items 1 to 12, above, comprise forming the reaction mixture; providing a CMP polishing pad having one or more apertures or openings each having a thickness and an outer dimension adapted to fit an endpoint detection window, preferably, by stamping or punching the opening therein; placing the CMP polishing pad on a flat surface with its polishing surface facing up on a sealing backing chosen from a removable tape, such as a fluoropolymer or polytetrafluoroethylene lined tape, a glass plate bearing a pressure sensitive adhesive, and/or a vacuum beneath the CMP polishing pad; filling each of the one or more openings with the reaction mixture so that the reaction mixture comes to within 1 mm of flush to the polishing surface of the CMP polishing pad; placing a transparent flat membrane or glass plate over the filled openings or providing an inert, low oxygen environment such as nitrogen gas; and curing the reaction mixture with an ultraviolet (UV) light or light source that emits light comprising UV light, such as for a period of from 1 to 30 minutes or, preferably, from 2 to 15 minutes.

In accordance with the methods of making a CMP polishing of the present invention as stated in the previous paragraph, wherein the forming the reaction mixture comprises: drying the polymeric diol; reacting, preferably, while heating to from 65 to 85° C., the cycloaliphatic diisocyanate and the polymeric diol in a molar ratio of from 1.9:1 to 3.2:1 or, preferably, from 1.98:1 to 2.5:1, to form the linear cycloaliphatic urethane macromonomer; and then reacting, preferably, while heating to from 65 to 85° C., the hydroxyl functional alkyl (meth)acrylate and the linear cycloaliphatic urethane macromonomer in a molar ratio of from 0.98:1 to 1.4:1 or, preferably, from 0.999:1 to 1.12:1 to form the linear cycloaliphatic urethane macromonomer having (meth)acrylate endgroups.

In accordance with the methods of making a CMP polishing of the present invention as stated in the previous two paragraphs, wherein the forming the reaction mixture further comprises: Mixing, preferably, in the absence of any light or UV radiation, the linear cycloaliphatic urethane macromonomer having (meth)acrylate endgroups with one or more initiator, preferably, a photoinitiator, or, more preferably, a photoinitiator and a co-initiator or accelerator until a homogeneous reaction mixture results.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "carbamate" refers to a urethane or (—RNCOOR'—) group which is the reaction product of an isocyanate group RNCO and an alcohol R'OH.

As used herein, unless otherwise indicated, the term "molecular weight" or "average molecular weight" means a formula weight for a given material as reported by its manufacturer. An average molecular weight refers to the molecular weight reported for a distribution of molecules in a given material, e.g. a polymer distribution.

As used herein, the term "amount of (meth)acrylate endgroups" refers to the amount, in wt. %, of a "$CH_2$=CHCOO—" or a "$CH_2$=CH($CH_3$)COO—" group present in a linear cycloaliphatic urethane macromonomer having such (meth)acrylate endgroups.

As used herein, the term "NCO content", "% NCO" or "isocyanate content" refers to the amount of unreacted or free isocyanate groups in a given linear cycloaliphatic urethane macromonomer prior to its reaction with a hydroxyl functional alkyl (meth)acrylate to form the (meth) acrylate endgroups thereon.

As used herein, the term "stoichiometry" of a reaction mixture refers to the ratio of molar equivalents of NCO groups to the number of molar equivalents of OH groups in a given reaction mixture.

As used herein, the term "reacted isocyanate" means any isocyanate group which has formed a urethane and includes the NCO moiety in the urethane but not the corresponding hydrocarbyl or active hydrogen substituents of the isocyanate or the polymer diol, or the content thereof. As used herein, the term "unreacted isocyanate" refers to the NCOH moiety in a diisocyanate which has not reacted with an active hydrogen, or the content thereof.

As used herein, the term "polyurethanes" refers to polymerization products from difunctional or polyfunctional isocyanates, e.g. polyetherureas, polyisocyanurates, polyurethanes, polyureas, polyurethaneureas, copolymers thereof and mixtures thereof.

As used herein, the term "semiconductor wafer" is intended to encompass a semiconductor substrate, such as an unpatterned semiconductor or one having a pattern, a semiconductor device, various packages for various levels of interconnection, including a single-chip wafer or a multiple-chip wafer, a substrate for a light emitting diode (LED), or other assemblies requiring solder connections.

As used herein, the term "semiconductor substrate" is defined to mean any construction comprising semiconductive material. A semiconductor substrate includes semiconductor devices and any substrate having one or more semiconductor layers or structures which include active or operable portions of semiconductor devices.

As used herein, the term "semiconductor device" refers to a semiconductor substrate upon which at least one microelectronic device has been or is being fabricated.

As used herein, the terms "Shore D hardness" and "Shore A hardness" are the hardness values of a given material as measured after a given time period according to ASTM D2240-15 (2015), "Standard Test Method for Rubber Property—Durometer Hardness". Hardness was measured on a Rex Hybrid hardness tester (Rex Gauge Company, Inc., Buffalo Grove, Ill.), equipped, respectively, with a D or A probe. Four samples were stacked and shuffled for each hardness measurement; and each specimen tested was conditioned by placing it in 50 percent relative humidity for five days at 23° C. before testing and using methodology outlined in ASTM D2240-15 (2015) to improve the repeatability of the hardness tests.

As used herein, the term "SG" or "specific gravity" refers to the weight/volume ratio of a rectangular cut out of a polishing pad or layer in accordance with the present invention.

As used herein, the term "solids" means any material other than water or ammonia that does not volatilize in use conditions, no matter what its physical state. Thus, liquid reactants that do not volatilize in use conditions are considered "solids".

As used herein, the term "substantially free of unreacted isocyanate" means that a given composition comprises 2,000 ppm or less, or, preferably, 1,000 ppm of any isocyanate group.

As used herein, the term "tan delta (tan δ)" means the value G"/G' of a given material, as determined, above, by DMA. A peak value of tan delta (tan δ) corresponds to the Tg or glass transition temperature of a given material.

As used herein, the term "Tg" or "glass transition temperature" of a given material refers to the temperature at which the tan delta of that material peaks in DMA testing. Samples were cut with a 6.5 mm width and 36 mm length. An ARES G2 tensional rheometer or a Rheometric Scientific RDA3 (both from TA instruments) were used in accordance with ASTM D5279-13 "Standard Test Method for Plastics: Dynamic Mechanical Properties: In Torsion" (2013). The gap separation was 20 mm. Instrument analysis parameters were set at 100 g of preload 0.2% strain, oscillation speed of 10 rads/sec, and with a temperature ramp rate of 3° C./min from −100° C. to 150° C.

As used herein, the term "% Transmittance (DPT)" or "double pass transmittance" or "DPT" at a given wavelength as used herein and in the appended claims in reference to an endpoint detection window is determined using the following equation: $DPT=(IW_{Si}-IWo)\div(IA_{Si}-IA_D)$ wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light through the thickness, $T_W$, of the window and measuring at the point of origin the intensity of light reflected back through the thickness of the window, $T_W$, from a surface positioned against a second face of the endpoint detection window substantially parallel to the first face; wherein $IW_{Si}$ is a measurement of the intensity of light that passes through the window from the point of origin and reflects off the surface of a silicon blanket wafer placed against a second face of the window back through the window to the point of origin; wherein $IW_D$ is a measurement of the intensity of light that passes from the point of origin through the window and reflects off the surface of a black body and back through the window to the point of origin; wherein $IA_{si}$ is a measurement of the intensity of light that passes from the point of origin through a thickness of air equivalent to the thickness, $T_W$, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light reflected off a black body at the light emitting surface of the 3 mm fiber optic cable.

As used herein, the term "% Transmittance at 400 nm" or is the % transmittance exhibited by an endpoint detection window for light having a wavelength of 400 nm.

As used herein, the term "polishing medium" and in the appended claims encompasses particle containing polishing solutions and non-particle-containing polishing solutions, such as abrasive free and reactive liquid polishing solutions.

As used herein, the term "UV Cut-off" is defined as wavelength at half-maximum in the step from zero transmission to highest transmission in the range of from 200 nm to 800 nm.

As used herein, the term "window discoloration" is measured from accelerated UV stability measurements. For this measurement, a specific diameter region of a window material set at 6 mm diameter, is exposed to high intensity of UV-A light with peak intensity of 365 nm for a short duration time. The intensity and duration is chosen to correspond to UV exposure of a window during typical pad life. For example, if the intensity of exposed light is 330+/−30 mW/sq. cm (at 365 nm) 45 seconds of exposure corresponds to a typical pad life (6,000,000 flashes of a flashlamp used in CMP polishing). Discoloration is measured from the ratio of window transmission of UV-exposed region of the analyte window to the transmission of an unexposed window.

As used herein, the term "wt. %" stands for weight percent.

In accordance with the present invention, endpoint detection windows of free radical or UV cured linear cycloaliphatic urethane macromonomers having (meth)acrylate endgroups provide when wet a high % Transmittance at wavelengths of from 300 to 400 nm. After the endpoint detection windows of the present invention were cast in CMP polishing pad samples and conditioned, the relatively soft endpoint detection windows demonstrated superior UV transmission. Conditioning of a CMP polishing pad generally abrades the pad surface and is expected to reduce the endpoint detection window transparency as textures form on their surface in conditioning. Improved endpoint detection window response to pad conditioning was observed both in UV curable resins, containing a photoinitiator, and in thermal initiator cured endpoint detection windows as well. Moreover, the endpoint detection window material of the present invention is readily handled as a fluid and can be dispensed into an aperture in a CMP polishing pad and cured in situ without deforming the endpoint detection window material, such as by placing a non-stick or removable tape below the aperture and then curing.

The present inventors have discovered that the hardness of the endpoint detection windows of the present invention can be lower than previously thought because they hold up under wet conditioned; the endpoint detection windows of the present invention remain durable when wet conditioned and throughout wet CMP polishing. The reaction mixtures of the present invention enable the formation of endpoint detection windows which are durable enough to find use in a hard chemical mechanical polishing (CMP polishing) pad, such as a pad having a Shore D hardness ASTM D2240-15 (2015) of from 40 to 90. The harder (higher Tg) endpoint detection windows result from reaction mixtures of the present invention having a cycloaliphatic dicarbamate of a polymeric diol containing repeat carbonate groups in the macromonomer chain or a shorter chain polymeric diol, which raises the % NCO at a 1:1 NCO:OH mole ratio. In addition, the reaction mixture enables the formation of softer (low Tg) endpoint detection windows for soft CMP polishing pads for which Shore A hardness (ASTM D2240-15 (2015) would be a better hardness measure. Softer endpoint detection windows result from reaction mixtures of the present invention comprising a polyol subunit having a polyether group or a longer chain polymeric diol of a higher molecular weight, such as 1,200 or higher, which lowers the % NCO at a 1:1 NCO:OH mole ratio.

In accordance with the present invention, (meth)acrylate endgroups in the linear cycloaliphatic urethane macromonomers comprise aliphatic acrylates or methacrylates which contain fewer unsaturations than their aromatic counterparts while also being urethanes improving compatibility to polyurethane CMP polishing pads. The aliphatic (meth)acrylate endgroups contain limited unsaturation functionality, such as double bonds, carbonyls, or aromatic rings, and thus provide optical transparency and good UV transparency.

In accordance with the present invention, transmission at lower wavelengths of the UV spectrum is improved (lower transparency loss ($\lambda_{UV0}$)) by utilizing a minimum amount of isocyanate and methacrylate possible in the formulation to achieve a fully cured endpoint detection window. This can be achieved by setting the diol:isocyanate mole ratio at a preferred 1:2 to avoid free NCO groups, and by setting the isocyanate:(meth)acrylate mole ratio at a preferred 1:1. The ultimate limit is then defined by the lowest % NCO possible for a 1:2 diol:isocyanate mole ratio, which is dictated by selecting the highest diol molecular weight workable; the result is a softer endpoint detection window. Accordingly, relatively soft endpoint detection windows have been found to be durable enough to withstand CMP polishing conditions even for hard pad applications, such as oxide removal.

The mixtures used to form the linear cycloaliphatic urethane macromonomers in accordance with the present invention comprise an aliphatic polymeric diol, such as polypropylene glycol, polycarbonate-containing diol, or polytetramethylethylene glycol, which is end-capped with an aliphatic isocyanate, such as a 4,4'-methylene dicyclohexyl diisocyanate (H12MDI), isophorone diisocyanate (IPDI), optionally in excess of the isocyanate. The linear cycloaliphatic urethane macromonomer of the present invention is further end-capped with a hydroxyl functional alkyl (meth)acrylate, such as one chosen from a $C_1$ to $C_4$ hydroxyalkyl acrylate, a $C_1$ to $C_4$ hydroxyalkyl methacrylate, or glycerol (meth)acrylate, preferably, a $C_1$ to $C_4$ hydroxyalkyl methacrylate, preferably, hydroxyethyl methacrylate (HEMA). The (meth)acrylate may be present in excess. The formulations are then cured with an aliphatic photoinitiator, such as a camphorquinone, and, preferably, also a tertiary amine based co-initiator or accelerator, such as N-methyldiethanolamine.

The reaction mixtures of the present invention are free or substantially free (less than 10,000 ppm, based on the total solids weight of the reaction mixture) of aromatic diisocyanates or polyisocyanates. Aromatic diisocyanates or polyisocyanates impair the % Transmittance of polyurethanes made therefrom at wavelengths of 400 nm or less.

In the reaction mixtures in accordance with the present invention for making endpoint detection windows, as set forth in accordance with any one of items 1-12, above, the mechanical properties are tunable through altering the molecular weight of the diol between 450-2000 g/mol, or, preferably, 600 to 1500. If too high, the reaction mixture is too soft there is no full cure, as shown by tack; if too low, there is less transparency in the resulting endpoint detection window because the reaction mixture will require more isocyanate and thus, more cycloaliphatic diisocyanate.

In accordance with the linear cycloaliphatic urethane of the present invention, the polymeric diol is chosen from a polycarbonate diol, such as any of the reaction product of polyester glycols with alkylene carbonates, for example, polycaprolactone polyol with alkylene carbonate; polyester polycarbonate polyols obtained by reacting ethylene carbonate with a diol or glycol and reacting the resulting reaction mixture with an organic dicarboxylic acid, and polycarbonate polyols obtained by ester exchange reaction of a diol or polyether diol compound with alkylene carbonate, and the (B)(ii) triol is trimethylol propane (TMP), propoxylated trimethylolpropane having from 1 to 4 propoxy groups, or propoxylated glycerol having from 2 to 6 propoxy groups, preferably, TMP.

Preferably, to control the structure of the linear cycloaliphatic urethane macromonomer having (meth)acrylate endgroups and limit the polydispersity the cycloaliphatic diisocyanate used to make the reaction mixture in accordance with the present invention is less reactive with the polymeric diol and requires some heating to react with the polymeric diol.

In accordance with the present invention, the amount of (meth)acrylate groups should be high enough to insure that the mixture containing them and a linear cycloaliphatic urethane is remains flowable. Meanwhile, the amount of (meth)acrylate groups should remain low enough that no free (meth)acrylate groups will end up in the endpoint detection window. More (meth)acrylate is used when more isocyanate is available for reaction and endcapping.

The present invention provides a method of making a CMP polishing pad according to the present invention, comprising: providing a CMP polishing layer having a polishing surface; separately, forming an endpoint detection window from the reaction mixture of the present invention as in any one of items 1 to 12 above in situ; in the polishing layer to provide a chemical mechanical polishing pad; wherein the endpoint detection window is molded to achieve its desired dimensions.

The endpoint detection windows in accordance with the present invention are gas or bubble free and are substantially water free, or, preferably, water free. Accordingly, polymeric diols are dried in a vacuum oven before making the linear cycloaliphatic urethane prepolymer. Degassing or avoiding bubbles is not necessary as the reaction mixtures are cured under pressure between two plates or two sealed surfaces which are flush to the bottom and the top of the CMP polishing pad in which they are reacted.

The chemical mechanical polishing pads of the present invention may further comprise at least one additional layer interfaced with the polishing layer, such as a sub pad. The additional layer can have a slightly smaller opening or aperture than the polishing layer of the CMP polishing pad which is concentric with or having the same center point as the hole, aperture or opening in the polishing layer so as to enable optical detection while providing a shelf that the endpoint detection window can rest upon and interface with. Preferably, the polishing layer is interfaced with the at least one additional layer using an adhesive. The adhesive can be selected from pressure sensitive adhesives, hot melt adhesives, contact adhesives and combinations thereof. Preferably, the adhesive is a hot melt adhesive or a pressure sensitive adhesive. More preferably, the adhesive is a hot melt adhesive.

In accordance with the present invention, methods of polishing a substrate, comprise: Providing a substrate selected from at least one of a magnetic substrate, an optical substrate and a semiconductor substrate; providing a chemical mechanical (CMP) polishing pad having an endpoint detection window as in any one of items 1 to 12, above; creating dynamic contact between a polishing surface of the polishing layer of the CMP polishing pad and the substrate to polish a surface of the substrate; and, conditioning of the polishing surface of the polishing pad with an abrasive conditioner.

More particularly, the present invention provides a method of polishing a substrate, comprising: providing a chemical mechanical polishing apparatus having a platen, a light source and a photosensor; providing at least one substrate; providing a chemical mechanical polishing pad as in any one of items 1 to 12, above; installing onto the platen the chemical mechanical polishing pad; optionally, providing a polishing medium at an interface between the polishing surface and the substrate; creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor.

In accordance with the present invention, methods of using the endpoint detection windows is specifically a method of detecting the end-point of polishing by irradiating a substrate via a CMP polishing pad through the endpoint detection window, with a light beam, and monitoring an interference signal generated by reflection of the light beam. As the light beam, for example, a white LED or white light using a halogen or deuterium lamp having a light of wavelengths of from 300 to 800 nm is generally used. In such methods, the end-point is determined by knowing an approximate depth of surface unevenness through monitoring of a change in the thickness of a surface layer of a wafer. When such change in thickness becomes equal to the thickness of the unevenness, the CMP process is finished. Accordingly, one determines a CMP polishing endpoint by transmitting light from the light source through the endpoint detection window and analyzing the light reflected off the surface of the substrate back through the endpoint detection window incident upon the photosensor. As a method of detecting the end-point of polishing by such optical means and a polishing pad used in the method, various methods and polishing pads have been proposed.

During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection.

The polishing layer of the chemical mechanical polishing pad of the present invention has a polishing surface adapted for polishing a substrate. Preferably, the polishing surface is adapted for polishing a substrate selected from at least one of a magnetic substrate, an optical substrate and a semiconductor substrate. More preferably, the polishing surface is adapted for polishing a semiconductor substrate.

The polishing layer of the chemical mechanical polishing pad of the present invention is preferably made of a polymeric material comprising a polymer selected from polycarbonates, polysulfones, nylons, polyethers, polyesters, polystyrenes, acrylic polymers, polymethyl methacrylates, polyvinylchlorides, polyvinylfluorides, polyethylenes, polypropylenes, polybutadienes, polyethylene imines, polyurethanes, polyether sulfones, polyamides, polyether imides, polyketones, epoxies, silicones, EPDM, and combinations thereof. Preferably, the polishing layer comprises a polyurethane. One of ordinary skill in the art will understand to select a polishing layer having a thickness suitable for use in a chemical mechanical polishing pad for a given polishing operation. Preferably, the polishing layer exhibits an average thickness of 20 to 150 mils (more preferably 30 to 125 mils; most preferably 40 to 120 mils).

Preferably, the polishing surface has macrotexture selected from at least one of perforations and grooves. Perforations can extend from the polishing surface part way or all the way through the thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, polishing layer of the chemical mechanical polishing pad of the present invention has a polishing surface adapted for polishing the substrate, wherein the polishing surface has a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

The present invention will now be illustrated in detail in the following non-limiting Examples:

In the following Examples, unless otherwise stated, all pressures are standard pressure (101 kPa) and all temperatures are ambient or room temperature (~22-23° C.). The following raw materials were used in the Examples:

H12MDI: Methylene bis (4-cyclohexylisocyanate), a.k.a. dicyclohexylmethane-4,4'-diisocyanate;

HEMA: Hydroxyethyl methacrylate;

Polymeric Diol 1: Linear, hydroxyl-terminated, aliphatic polycarbonate diol with a weight average molecular weight of approx. 650 g/mol, sold as Desmophen™ C XP 2716 (Covestro AG, Leverkusen, Del.);

Polymeric Diol 2: Linear poly(propylene glycol) (PPG) produced by reacting propylene glycol with propylene oxide where propylene glycol acts as the initiator, 1,000 MW (weight average molecular weight); (sold as Voranol™ 220-110, Dow Polyurethanes, The Dow Chemical Company, Midland, Mich. (Dow));

Polymeric Diol 3: Linear poly(propylene glycol) (PPG), 1,200 MW (weight average molecular weight); (sold as Voranol™ 220-094 (Dow)); and, Polymeric Diol 4: Linear poly(propylene glycol) (PPG), 2,000 MW (weight average molecular weight); (sold as Voranol™ 220-056 (Dow).

Example 1

Reaction mixtures were made using the indicated materials. Prepolymers were first synthesized by mixing the PPG and isocyanate components, heating to 80° C., and allowing to react for 4 hours. After the prepolymer was synthesized, the HEMA was added to the prepolymer and the two materials were mixed via a vortex mixer mixing at 1000 RPM for 30 s, and then placed in an 80° C. oven and allowed to react for 24 hours. The reaction progress was monitored by Fourier Transform Infrared (FTIR) spetroscopy with the absence of the NCO peak indicating completion. The ratios of diol:isocyanate and isocyanate:methacrylate are listed in Table 1, below.

TABLE 1

Window Reaction Mixtures

| Example | Polymeric Diol | Diol MW (g/mol) | Diol:Diisocyanate (mol ratio) | NCO % (wt. %) | Isocyanate:Methacrylate (mol ratio) |
|---|---|---|---|---|---|
| 1 | 1 | 650 | 1:2.6 | 10.0 | 1:1.22 |
| 2 | 1 | 650 | 1:2 | 7.2 | 1:1 |
| 3 | 2 | 1000 | 1:3 | 9.5 | 1:1.24 |
| 4 | 2 | 1000 | 1:2 | 5.5 | 1:1 |
| 5 | 3 | 1200 | 1:2 | 4.9 | 1:1 |
| 6 | 4 | 2000 | 1:2 | 3.3 | 1:1 |

To each of the (meth)acrylate endgroup containing linear cycloaliphatic urethane macromonomers was added 0.1 wt. % camphorquinone and 0.2 wt. % N-methyldiethanolamine, based on the total weight of UV curable resin, to form a reaction mixture. Each reaction mixture was mixed until dissolved and then was poured into a metal mold mounted on a glass plate. Each reaction mixture was then sandwiched between the glass plate and another glass plate to prevent air contact with the reaction mixture. Each reaction mixture was then exposed to light from a metal halide bulb with an intensity of 105 mW/cm$^2$ for 5 minutes. The resulting plaques were later used for transmission testing.

Transmission Testing:

Each plaque made in the manner disclosed in the previous paragraph was cut into 5.12 cm×5.12 cm (2"×2") squares from the UV cured plaques. From each of the cut squares a 1.28 cm (0.5") diameter circle was punched. The transmission of the punched circle was tested, with the empty hole left in each square used as an air gap reference. The transmission of light or radiation through each punched circle was tested and measured using DH-2000™ light source (Ocean Optics, Dunedin, Fla.). Normalized transmission $T(\lambda)$ was calculated for each punched circle or "window" using the following equation:

$$T(\lambda) = \frac{T_{Si,windows} - T_{Dark,window}}{T_{Si,air} - T_{Dark,air}}$$

In the above equation, $T_{Dark,air}$ is the "dark" signal with no window (using empty spacer), set as the zero transmission point. $T_{Si,air}$ is the transmission with a silicon wafer serving as a reflective mirror covering the empty spacer. This value is normalized as the 100% transmission value. $T_{Dark,window}$ is the measurement of the window in the dark which accounts for the reflected light form the window surface. $T_{Si,window}$ is the measurement of light transmitted through the window with a silicon backing. The higher the transmission %, the better. An acceptable transmission result at 300 nm is 10% or better.

Conditioning Testing:

Small CMP polishing pads were prepared for the conditioning test. The polishing pads were punched out in a similar manner as the punched circle windows, above. Each 25.6 cm (10") CMP polishing pad material was punched from a larger pad made of polyurethane foam having a Shore D hardness of 65 and SG of 0.95. From there 1.28 cm (0.5") diameter holes or apertures were punched in the small polishing pads. A pressure sensitive adhesive (PSA) was applied to the back of each small pad. The small pads were then placed PSA side down onto a glass plate. Each indicated reaction mixture was applied to the apertures of the small pads with a syringe. Then, a second glass plate was then placed over each small pad. From there the same reaction mixture curing method was used as that used to make plaques, disclosed above. The resulting small pads containing molded windows were then removed from the glass plates and applied to the platen of an Ecomet™ 4 mini-polisher (Buehler, Lake Bluff, Ill.) equipped with aAK45™ conditioning disk (Saesol, Austin, Tex.). Each of the indicated small pads were conditioned at 180 rpm and 35.5 N (8 lbs) of downforce for 10 and 20 minute intervals. For the dry transmission tests, each small pad was allowed to air dry overnight (~12 Hours). For the wet transmission test, a drop of water was placed on the dry window in the small pad and allowed to soak the surface for 5 minutes.

TABLE 2

% Transmission or Transparency

| Example | Transparency @ 300 nm (%) | Transparency @ 280 nm (%) | Transparency @ 270 nm (%) | Transparency @ 250 nm (%) |
|---|---|---|---|---|
| 1 | 14.7 | .48 | 0 | 0 |
| 2 | 19.15 | .59 | 0 | 0 |
| 3 | 8.33 | .32 | 0 | 0 |
| 4 | 11.08 | .95 | 0 | 0 |
| 5 | 23.67 | 4.28 | 1.81 | 0 |
| 6 | 12.58 | 5.98 | 2.70 | 0 |

As shown in Table 2, above, by reducing the diol:isocyanate ratio to 1:2 in Example 4, the transmission is extended to a lower wavelength ($\lambda$) than in Example 3. The same trend is seen comparing Example 2 to Example 1. Comparison of Example 4 and Example 2, shows that an aliphatic polycarbonate polymeric diol provides improved transmission at 300 nm versus a PPG polymeric diol. Further, by increasing the molecular weight of the polymeric diol to 1200 and keeping the 1:2 diol:isocyanate ratio, as in Example 5, the % NCO content of the material was reduced to 4.8% and the transmission was further extended to ~260 nm. Still further, the presence of free (meth)acrylate groups in the materials of Examples 1 and 3 reduced % transmission; compare Examples 2 and 4, respectively, to Examples 1 and 3. In comparison to the window material of Example 6, it was found that any further increase of the MW of the polymeric diol and thus decrease in the % NCO, led to a tacky material indicating incomplete curing. This also led to a decrease in the transmission at 300 nm.

TABLE 3

Effect of Conditioning and Wet vs. Dry

| Example | Hardness (shore D) | Tensile Modulus (MPa) | Transmission @ 400 nm after conditioning-dry (%) | Transmission @ 400 nm after conditioning-wet (%) |
|---|---|---|---|---|
| 1 | 76.9 | 693 | 10.05 | 14.64 |
| 3 | 58.9 | 288 | 8.92 | 21.02 |
| 4 | 36.5 | 42 | 10.82 | 25.79 |
| 5 | 24 | 17 | 14.04 | 30.40 |

As shown in Table 3, above, and especially in softer endpoint detection windows of Examples 3, 4 and 5, the transmission of the UV curable samples after conditioning in dry and wet states shows improved transmission in the wet state. The same wet transmission is observed in Example 1. The improved transmission even results in soft endpoint detection windows like those of Example 4 which one would have expected to lack durability and lose transmission during use, such as through abrasion. Because the endpoint detection windows will be wet when used, the increase in wet transmission will correspond to improved window performance for endpoint detection.

I claim:

1. A chemical mechanical (CMP) polishing pad for polishing a substrate chosen from at least one of a magnetic substrate, an optical substrate and a semiconductor substrate comprising a CMP polishing pad, the CMP polishing pad having one or more endpoint detection windows which is the cured product of a reaction mixture of a linear cycloaliphatic urethane macromonomer having two (meth)acrylate endgroups bound via cycloaliphatic dicarbamate esters to a polyether, polycarbonate or polyester chain, or an cycloaliphatic urethane oligomer thereof, and an aliphatic initiator, wherein the total isocyanate content in the urethane macromonomer ranges from 3.3 to 10 wt. %, and, further wherein, the composition comprises less than 5 wt. % of unreacted (meth)acrylate monomer and is substantially free of unreacted isocyanate.

2. The chemical mechanical (CMP) polishing pad as claimed in claim 1, wherein the cycloaliphatic dicarbamate of the linear cycloaliphatic urethane macromonomer contains a $C_6$ to $C_{18}$ cycloaliphatic group.

3. The chemical mechanical (CMP) polishing pad as claimed in claim 1, wherein the cycloaliphatic dicarbamate of the linear cycloaliphatic urethane macromonomer contains a $C_{10}$ to $C_{16}$ cycloaliphatic group.

4. The chemical mechanical (CMP) polishing pad as claimed in claim 1, wherein the cycloaliphatic dicarbamate of the linear cycloaliphatic urethane macromonomer is the reaction product of an active hydrogen of a polymeric diol and a cycloaliphatic diisocyanate chosen from 1,4-cyclohexane diisocyanate, 4,4'-dicyclohexylmethane diisocyanate, or isophorone diisocyanate.

5. The chemical mechanical (CMP) polishing pad as claimed in claim 1, wherein the linear cycloaliphatic urethane macromonomer comprises the carbamate of a polymeric diol having a polyether, polycarbonate or polyester chain having an average molecular weight of from 450 to 2,000.

6. The chemical mechanical (CMP) polishing pad as claimed in claim 5, wherein the linear cycloaliphatic urethane macromonomer comprises the carbamate of a polymeric diol having a polyether, polycarbonate or polyester chain having an average molecular weight of from 600 to 1,500.

7. The chemical mechanical (CMP) polishing pad as claimed in claim 5, wherein the polymeric diol comprises a polypropylene glycol; a polyethylene glycol; a polytetramethylene glycol; polycarbonate-group containing diol; or their block copolymers or mixtures.

8. The chemical mechanical (CMP) polishing pad as claimed in claim 1, wherein the linear cycloaliphatic urethane macromonomer having two (meth)acrylate endgroups comprises from two to ten cycloaliphatic dicarbamate groups and has a weight average molecular weight of from 1,000 to 10,000.

9. The chemical mechanical (CMP) polishing pad as claimed in claim 1, wherein the linear cycloaliphatic urethane macromonomer having two (meth)acrylate endgroups contains, in esterified form, a hydroxyl functional alkyl (meth)acrylate.

10. The chemical mechanical (CMP) polishing pad as claimed in claim 1, wherein the aliphatic initiator is a photoinitiator and the amount of the photoinitiator ranges from 0.05 to 0.5 wt. % or, preferably, from 0.08 to 0.15 wt. %, based on the total solids weight of the reaction mixture.

\* \* \* \* \*